(12) United States Patent
Steeneken et al.

(10) Patent No.: US 9,576,738 B2
(45) Date of Patent: Feb. 21, 2017

(54) TUNABLE MEMS CAPACITOR (71) Applicant: NXP B.V., Eindhoven (NL)

(72) Inventors: Peter G. Steeneken, Valkenswaard (NL); Klaus Reimann, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/543,146

(22) Filed: Nov. 17, 2014

(65) Prior Publication Data

US 2015/0092315 A1    Apr. 2, 2015

Related U.S. Application Data

(63) Continuation of application No. 12/663,829, filed as application No. PCT/IB2008/052253 on Jun. 9, 2008, now Pat. No. 8,890,543.

(30) Foreign Application Priority Data

Jun. 13, 2007  (EP) .................................... 07110209

(51) Int. Cl.
*H01G 7/06* (2006.01)
*H01G 5/16* (2006.01)
(Continued)

(52) U.S. Cl.
CPC ............. *H01G 5/16* (2013.01); *H01G 5/013* (2013.01); *H01G 5/0136* (2013.01); *H01G 7/06* (2013.01); *H03J 5/248* (2013.01); *H01G 2005/02* (2013.01)

(58) Field of Classification Search
CPC .......... G02B 26/001; H01G 5/14; H01G 5/16; H01G 5/18; H01G 5/013; H01G 5/0136; H01G 5/40; H01G 7/06; H01H 59/0009; H04R 2201/003; H04R 19/005; H04R 19/04; H04R 3/00; G01P 15/125; B81B 3/0021; B81B 2201/0235; B81B 2201/0264; B81B 2201/0257; B81B 2203/0127; B81B 7/007; G01R 1/44; G01R 17/16
See application file for complete search history.

(56) References Cited

U.S. PATENT DOCUMENTS 4,490,772 A   12/1984  Blickstein
4,977,480 A   12/1990  Nishihara
(Continued)

FOREIGN PATENT DOCUMENTS

CN    1651876 A    8/2005
EP    0 725 408 A  8/1996
(Continued)

OTHER PUBLICATIONS

Wang, Guong, et al; "A High Performance Tunable RF MEMS Switch Using Barium Strontium Titanate (BST) Dielectrics for Reconfigurable Antennas and Phase Arrays"; IEEE Antennas and Wireless Propagation Letters vol. 4; 2005; p. 217-220.

(Continued)

*Primary Examiner* — Alesa Allgood (57) ABSTRACT

A capacitive MEMS structure comprising first and second opposing capacitor electrode arrangements, wherein at least one of the electrode arrangements is movable, and a dielectric material located adjacent to the second electrode arrangement, wherein the second electrode arrangement is patterned such that it includes electrode areas and spaces adjacent to the electrode areas, and wherein the dielectric material extends at least partially in or over the spaces.

14 Claims, 10 Drawing Sheets

(51) Int. Cl.
*H03J 5/24* (2006.01)
*H01G 5/013* (2006.01)
*H01G 5/00* (2006.01)

(56) References Cited

U.S. PATENT DOCUMENTS

| | | | |
|---|---|---|---|
| 5,312,790 A | 5/1994 | Sengupta et al. | |
| 6,307,452 B1 | 10/2001 | Sun | |
| 6,687,112 B2 | 2/2004 | Chiou et al. | |
| 6,829,132 B2 | 12/2004 | Martin et al. | |
| 6,853,534 B2 | 2/2005 | Williams | |
| 6,856,219 B2 * | 2/2005 | Kawai | H01H 59/0009 200/181 |
| 6,962,832 B2 | 11/2005 | Chou | |
| 6,980,412 B2 | 12/2005 | Cheng et al. | |
| 7,012,317 B2 | 3/2006 | Yashima et al. | |
| 7,030,463 B1 | 4/2006 | Subramanyam et al. | |
| 7,031,137 B2 | 4/2006 | Robert | |
| 7,042,698 B2 | 5/2006 | Won et al. | |
| 7,088,566 B2 | 8/2006 | Martin et al. | |
| 7,141,989 B1 | 11/2006 | Liu | |
| 7,345,866 B1 | 3/2008 | Hsu et al. | |
| 7,667,946 B2 * | 2/2010 | Choi | H01G 5/0132 361/277 |
| 2002/0053954 A1 * | 5/2002 | Shamsaifar | H01P 1/213 333/135 |
| 2004/0124497 A1 | 7/2004 | Rottenberg et al. | |
| 2006/0125052 A1 | 6/2006 | Moon et al. | |
| 2006/0125746 A1 | 6/2006 | Sallese et al. | |
| 2007/0183116 A1 | 8/2007 | Combi et al. | |
| 2008/0089005 A1 | 4/2008 | Choi et al. | |
| 2008/0232023 A1 | 9/2008 | Oakes et al. | |

FOREIGN PATENT DOCUMENTS

| | | |
|---|---|---|
| EP | 1 383 234 A | 1/2004 |
| WO | 2006/046192 A1 | 5/2006 |
| WO | 2006/046193 A1 | 5/2006 |
| WO | 2006/117709 A | 11/2006 |
| WO | WO 2006/117709 * | 11/2006 |

OTHER PUBLICATIONS

Park, Jae Y., et al; "Monolithically Integrated Micromachined RF MEMS Capacitive Switches"; Sensors and Actuators A; Elsevier Sequoia S.A.; Lausanne, CH; vol. 89, No. 1-2; Mar. 20, 2001; p. 88-94; XP004317250; ISSN: 0924-4247.

Th G S M Rijks, P G Steeneken, J T M van Beek, M J E Ulenaers, A Jourdain, H A C Tilmans, J De Coster and R Puers, Microelectromechanical tunable capacitors for reconfigurable RF architectures. J. Micromech.Microeng. 16 (2006) 601-611.

* cited by examiner

TUNABLE MEMS CAPACITOR

This invention relates to tunable capacitors, in particular based on capacitive MEMS structures.

Tunable capacitors can be used in a variety of circuits, such as tunable filters, tunable phase shifters and tunable antennas. One application of growing interest is in RF and microwave communications systems, for example for use in low cost reconfigurable/tunable antennas.

Two of the most promising technologies for making tunable or switchable RF capacitors are RF MEMS switches and relays which provide mechanical alteration to the capacitor spacing, and capacitors with electrically tunable dielectrics.

RF MEMS switches have the advantage of a larger capacitance switching ratio, and tunable dielectrics have the advantage of better continuous capacitance tunability.

It has been proposed to combine these effects, by providing control of the dielectric spacing using a MEMS switch, in combination with a ferroelectric tunable dielectric, such as barium strontium titanate (BST). The combination of discrete control provided by a MEMS switch and analogue electrical control of the dielectric properties can enable continuous tunability of the capacitor. This approach is described in the article "A High Performance Tunable RF MEMS Switch Using Barium Strontium Titanate (BST) Dielectrics for Reconfigurable Antennas and Phase Arrays" by Guong Wang et al., IEEE Antennas and Wireless Propagation Letters Vol. 4, 2005 pp217-220.

Figure 1:
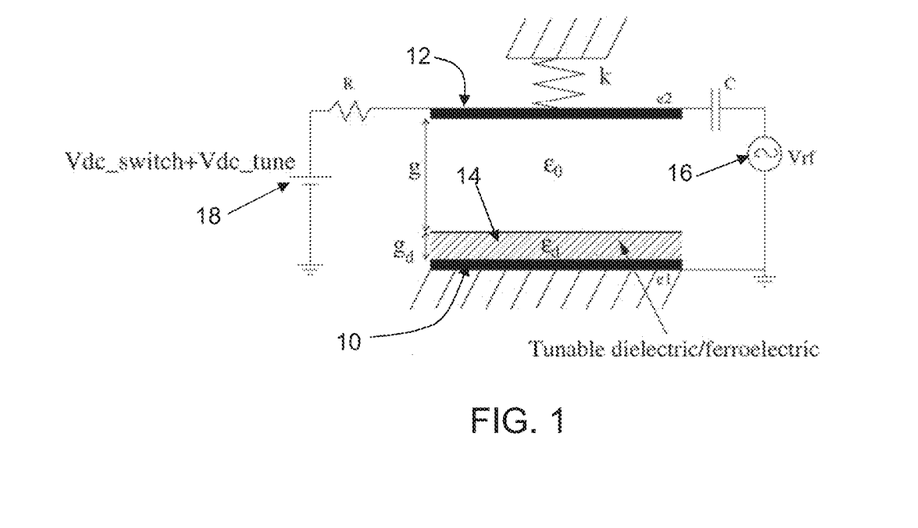
FIG. 1 is used to explain how the electrically tunable dielectric and MEMS controlled dielectric spacing can be combined.

FIG. 1 is used to explain how the electrically tunable dielectric and MEMS controlled dielectric spacing can be combined.

A tunable dielectric, ferroelectric or piezoelectric material can be used, such as $Ba_{1-x}Sr_xTiO_3$ or PZT as a dielectric layer 14. By combining a MEMS capacitor with a tunable dielectric, the advantages of the large capacitance switching range or RF MEMS switches are added to the advantages of the continuous tuning capability of tunable dielectrics. Moreover use is made of the beneficial high dielectric constant of ferroelectrics, which can be 10-200 times higher than that of conventional dielectrics like Silicon Nitride. This dramatically reduces device size and increases continuous tuning range.

The device comprises opposite capacitor plates 10 (e1)) and 12 (e2). The gap g is controlled by the MEMS switch represented by the spring k, based on the voltage applied to the plate 12. A dc voltage Vdc_switch is used to provide this MEMS switching function, from a dc voltage source 18. An rf ac voltage source 16 represents the rf signal that is flowing through the MEMS device during operation. The tunable dielectric has a tunable dielectric value $\epsilon_d$, whereas the remaining dielectric spacing is air or vacuum, with dielectric value $\epsilon_0$. The tunable dielectric is controlled by the voltage Vdc_tune, so that the single voltage applied to the electrode 12 controls the MEMS switching and dielectric tuning. The capacitor C and resistor R are optional decoupling components.

Figure 2:
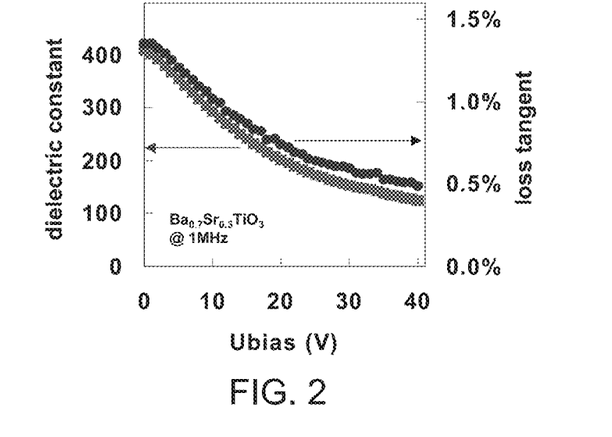
FIG. 2 shows the tunable dielectric characteristic curve for the arrangement of FIG. 1.

FIG. 2 shows the tunable dielectric characteristic curve. The maximum dielectric constant occurs if the voltage across the tunable dielectric (Ubias) is zero volts. In the configuration of FIG. 1 this maximum can never be reached because the MEMS switch will release before 0V.

According to the invention, there is provided a MEMS tunable capacitor comprising:

first and second opposing capacitor electrodes, wherein the second capacitor electrode is movable by a MEMS switch to vary the capacitor dielectric spacing, and thereby tune the capacitance;

a tunable dielectric material and a non-tunable dielectric material in series between the first and second electrodes, wherein the tunable dielectric material occupies a first dimension of the electrode spacing, and the non-tunable dielectric material occupies a second dimension of the electrode spacing;

a third electrode facing the movable second electrode for electrically controlling tunable dielectric material; and a controller, wherein the controller is adapted to vary the capacitor dielectric spacing for a first continuous range of adjustment of the capacitance of the MEMS capacitor, and to tune the dielectric material for a second continuous range of adjustment of the capacitance of the MEMS capacitor, thereby to provide a continuous analogue range of adjustment including the first and second ranges.

The invention thus provides a relay type arrangement for the capacitor under the control of the third electrode, with independent control of the dielectric properties. The device has continuous adjustability of capacitance.

The non-tunable dielectric dimension is preferably less than one third of the total effective actuation electrode spacing when the movable electrode is at the position corresponding to maximum electrode spacing.

This gap design enables a continuous adjustability of capacitance by preventing pull-in of the movable electrode during capacitor tuning.

The tunable dielectric material is preferably a solid and the non-tunable dielectric material is a gas. Thus, the movement of the second electrode displaces the gas dielectric (e.g. air or a vacuum).

The movable electrode can be at a position corresponding to minimum electrode spacing when the electrode spacing has dimension $g_d$, namely with only the tunable dielectric sandwiched between the first and second electrodes.

The tunable dielectric material preferably comprises a ferroelectric material, such as BST.

The ac rf voltage source can be used to control the tunable dielectric material, by means of a dc component added to the rf signal in the circuit in which the capacitor is used. A dc voltage source can be used for controlling the MEMS switching function.

The first and third electrodes can be provided on a static substrate, and the second electrode comprises a cantilever structure suspended over the static substrate. In one arrangement, only the first electrode is covered by the tunable dielectric material, or in another arrangement the first and third electrodes are covered by the tunable dielectric material. In the latter case, a fourth electrode can be provided over the tunable dielectric only above the first electrode.

The first and second electrodes can be flat, but the movable second electrode can instead be shaped such that a different gap is provided between the first and second electrodes and between the second and third electrodes. The MEMS switching function and dielectric tuning function can thus each be optimised.

The invention also provides a tunable antenna comprising an antenna device, a first tunable circuit including a capacitor of the invention for a transmission channel and a second tunable circuit including a capacitor of the invention for a reception channel.

The capacitors of the invention can also be used in a tunable capacitor network comprising a plurality of tunable capacitors or a plurality of static capacitors and at least one tunable capacitor in parallel.

Examples of the invention will now be described in detail with reference to the accompanying drawings, in which.

The invention provides a MEMS relay device, with a tunable dielectric, for example a ferroelectric or other tunable dielectric material such as $Ba_{1-x}Sr_xTiO_3$ or PZT.

In the figures, the structure of the device is shown only schematically.

In particular, the way the top electrode is formed and the way it moves has not been shown. In one known example, the top electrode can be formed as a suspended beam which is connected to the lower substrate at one lateral end. The detailed implementation will be routine to those skilled in the art of MEMS devices.

Figure 3:
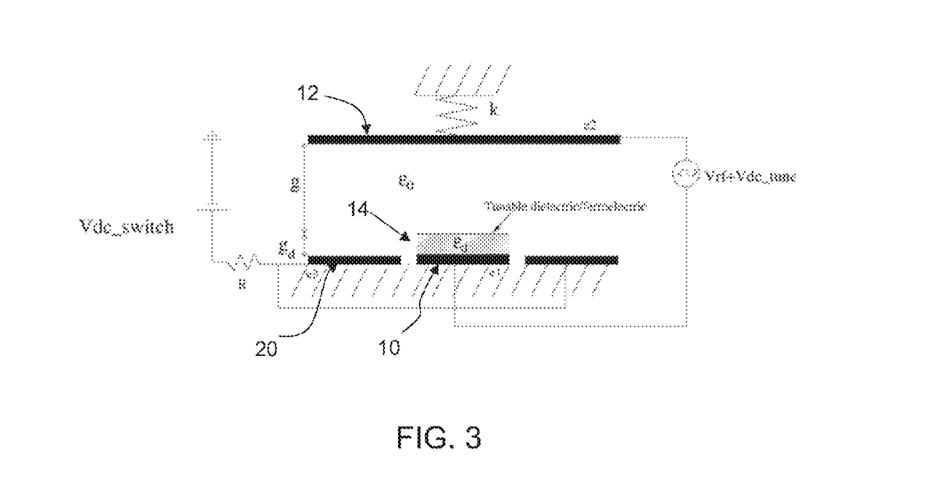
FIG. 3 shows a first possible arrangement with independent control of the MEMS switch and dielectric.

A first possible arrangement is shown in FIG. 3. The implementation of a capacitive relay is achieved by electrically separating the electrode 20 (e3) (which receives the high voltage which generates the electrostatic force that moves the electrode of the MEMS capacitor) from the electrodes 10,12 which form the RF capacitor (e1 and e2). When the MEMS switch is closed under the control of Vdc_switch, the dielectric constant $E_d$ can be tuned by applying a DC voltage Vdc_tune between electrodes e1 and e2. This results in a continuously tunable capacitor. The switch can remain closed regardless of the tuning voltage, because there is independent control of the switch (i.e. the dielectric spacing) and of the dielectric properties. The separated relay electrode 20 actuates the MEMS switch and thus controls movement of the electrode 12 (e2).

For example, the voltage vdc_tune can range from 0-5 V and vdc_switch can range from 0-50 V.

Figure 4:
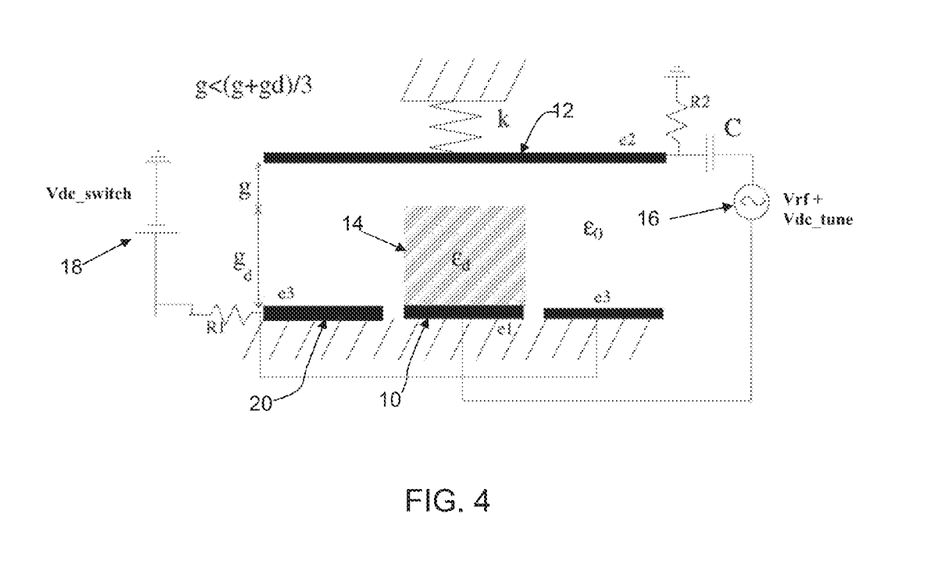
FIG. 4 shows an improvement to the design of FIG. 3 in accordance with the invention.

FIG. 4 shows an improvement to this basic design and which provides increased continuous tuning range while requiring only one tuning voltage control.

The arrangement comprises the same components as in FIG. 3, but the tunable dielectric is chosen to occupy most of the space between the capacitor electrodes used for dielectric tuning, in particular so that the remaining gap g is less than one third of the total gap. The resistor R2 and capacitor C are again optional.

In the example of FIG. 4, the tunable dielectric 14 is provided only over the electrode 10.

Because there is a tunable dielectric and a MEMS switch in the device, there are two relevant tuning ranges. Firstly there is the MEMS capacitance switching or tuning ratio $\alpha_{MEMS}=C_{on}/C_{off}$ if the device is purely used as a MEMS device. Secondly there is the tuning ratio of the tunable dielectric capacitor $\alpha_{TD}=C_{max}/C_{min}=\in_d(E_{max})/\in_d(0)$.

In the switch implementation of FIG. 1, the useful tuning range of the device in the closed state is less than $\alpha_{TD}=C_{max}/C_{min}$ because the voltage across the dielectric cannot be brought to zero without release of the MEMS device. The useful tuning range of the basic switch of FIG. 1 is indicated in FIG. 5.

Figure 5:
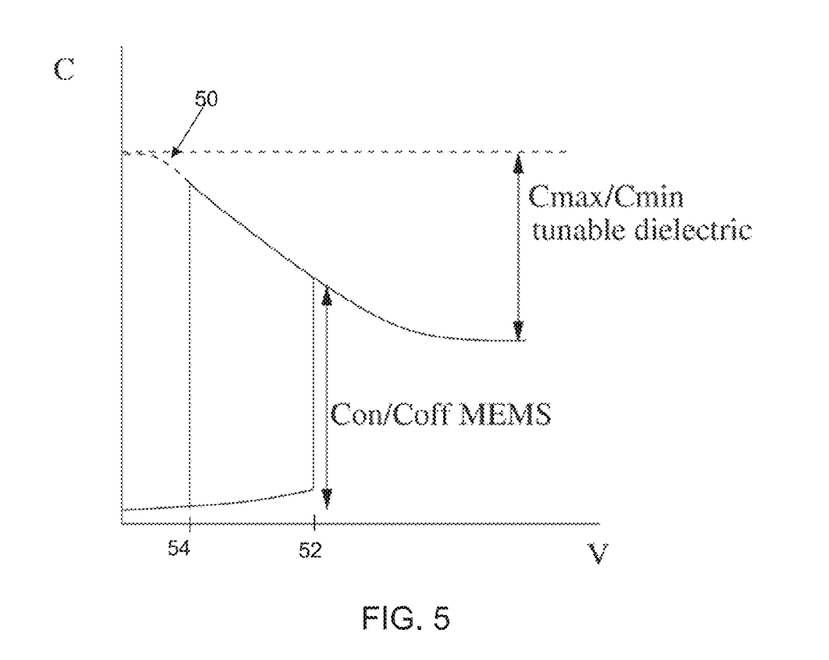
FIG. 5 is a sketch of the capacitance-voltage (C-V) characteristic of the configuration of FIG. 1.

FIG. 5 is a sketch of the capacitance-voltage (C-V) characteristic of the configuration of FIG. 1. After closing the switch (i.e. with high value of V above the level shown as 52), the capacitance of the device can be tuned continuously over a range which is less than the maximum tunable range of the tunable dielectric. When V drops below a certain value (shown as 54), the MEMS device switches, so that the maximum capacitance cannot be reached (region 50). The value V corresponds to Vdc_switch+Vdc_tune in FIG. 1 and C is the RF capacitance in FIG. 1 between electrodes e1 and e2.

Figure 6:
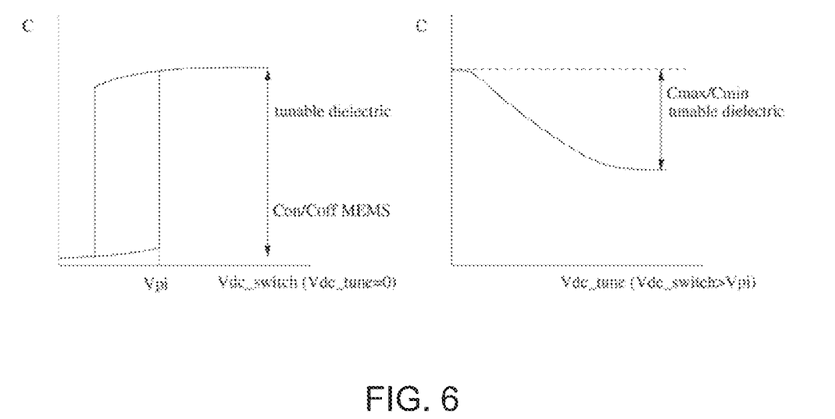
FIG. 6 shows the capacitance characteristics for the configuration in FIG. 3.

FIG. 6 shows the capacitance versus Vdc_tune and versus Vdc_switch for the configuration in FIG. 3. A larger continuous tuning range is achievable. The left plot in FIG. 6 shows the capacitance characteristic when the MEMS switch is controlled. The MEMS switch closes at Vdc_switch=Vpi and there is thus the step change in capacitance. The device has hysteresis so that it switches back to open at a lower voltage. The capacitance can also be tuned by more than 30% in the open state (Vdc_switch<Vpi). The right plot in FIG. 6 shows the capacitance characteristic when the dielectric is controlled with the switch closed (Vdc_switch>Vpi). There is no forbidden region such as 50 in FIG. 5.

In the implementation of the FIG. 4, the condition in equation (1) is satisfied, as mentioned above:

$$g<(g+g_d)/3 \quad (1)$$

A MEMS capacitor will show pull in when it has traveled one third of the gap used for the MEMS switch actuation (i.e. the gap between electrodes 12 and 20). The design of the invention takes this into account, in such a way that the top plate will touch the dielectric before pull-in occurs. Therefore, in the geometry of FIG. 4, full continuous tuning can be achieved. In this way, the electrode 12 is mechanically blocked from moving beyond the point at which pull-in occurs. This can be done by making the dielectric 14 thick as shown in FIG. 4, but it can also be achieved by using separate blocking stubs, as will be apparent from further examples below. These approaches can also be combined, with stubs preventing bending of the electrode 12, and the contact with the dielectric 14 in the blocking position giving the highest capacitance value.

The invention thus provides a MEMS switch and a tunable dielectric capacitor which are combined in such a way that both show continuous tuning.

Instead of a combination of digital and analog tuning, complete analog tuning becomes possible.

Figure 7:
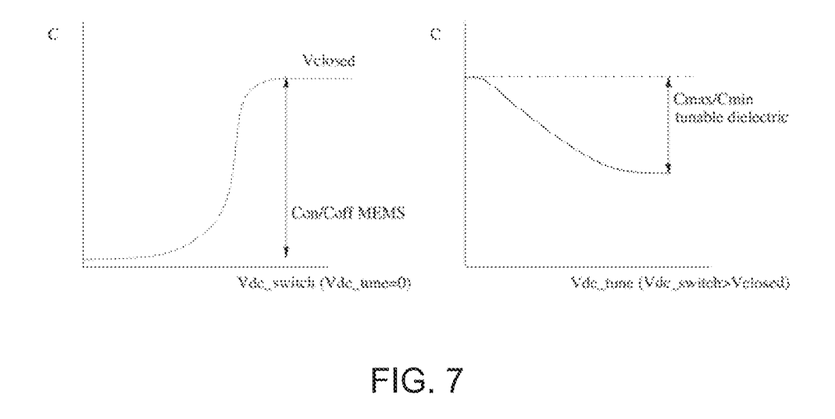
FIG. 7 shows the improved capacitance characteristics provided by the arrangement of FIG. 4.

FIG. 7 shows the improved performance provided by the invention and shows plots corresponding to FIG. 6. In this arrangement, continuous tuning over the full capacitance range is achieved. Furthermore, the slope of the Vdc_tune graph is less which allows more accurate tuning. Moreover, when large RF powers are present it is more favorable to use Vdc_tune than Vdc_switch to tune the capacitance value to reduce non-linearities.

Thus, for the capacitive MEMS relay of FIG. 4, two methods of tuning the capacitance are possible. First continuous tuning is possible using Vdc_switch. This can tune over a large capacitance range, but has two disadvantages:

A large slope in the C-V curves makes accurate tuning difficult.

High RF voltage between electrodes 10 and 12 will result in an additional force, which changes the C-Vdc_switch curve and makes accurate control of the capacitance difficult. Moreover, this generates non-linearities.

The tunable dielectric does not have these problems. Thus, to cover the full-range of tunability, Vdc_switch should be used to tune the small C values, and for capacitance values larger than a minimum value, Vdc_tune should be used with Vdc_switch>Vpi (the right graph of FIG. 7).

In combination with the large dielectric constants of the tunable dielectrics this can allow continuous tuning of the capacitance by a factor of 500.

A controller is used to drive the capacitor, and thereby set the desired capacitance. In accordance with the invention, the controller is adapted to vary the capacitor dielectric spacing for a first continuous range of adjustment of the capacitance of the MEMS capacitor, and to tune the dielectric material for a second continuous range of adjustment of the capacitance of the MEMS capacitor.

The first range is controlled by Vdc_switch, until the MEMS switch is closed, and the second range is controlled by Vdc_tune.

The two ranges are combined to provide a full continuous adjustable range, for example with a ratio of more than 100, 200, 300 or even more than 500.

Figure 8:
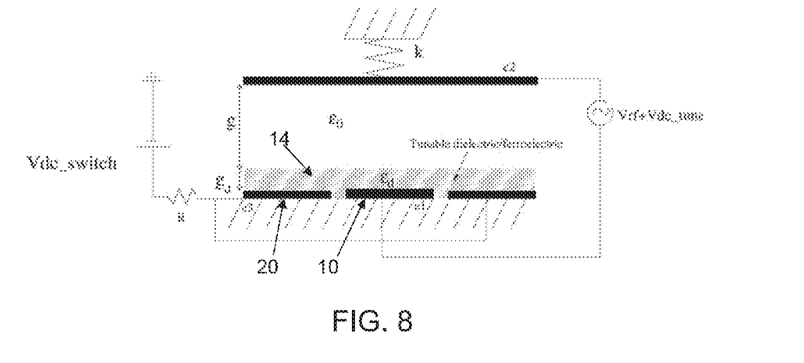
FIG. 8 shows a first alternative implementation in accordance with the invention.

FIG. 8 shows an alternative implementation in which the tunable dielectric covers all of the fixed plate electrodes. A different dielectric can be used on the electrodes 20 compared to the electrode 10, because the required properties of the dielectric on electrode 20 are different.

Figure 9:
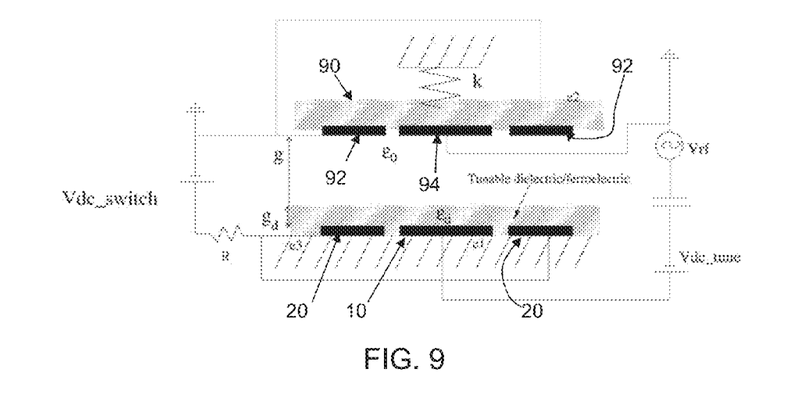
FIG. 9 shows a second alternative implementation in accordance with the invention.

FIG. 9 shows a modification in which both capacitor plates are provided with separate electrodes for the dielectric tuning and for the MEMS switching. Thus, each capacitor plate comprises a MEMS switch electrode 20 is and 92, and these face each other, and each capacitor plate has a set of dielectric tuning electrodes 10 and 94, which again face each other. As schematically shown, the movable electrode has an insulating substrate 90, so that independent voltages can be provided to the two sets of electrodes 92,94 on the movable plate.

Figure 10:
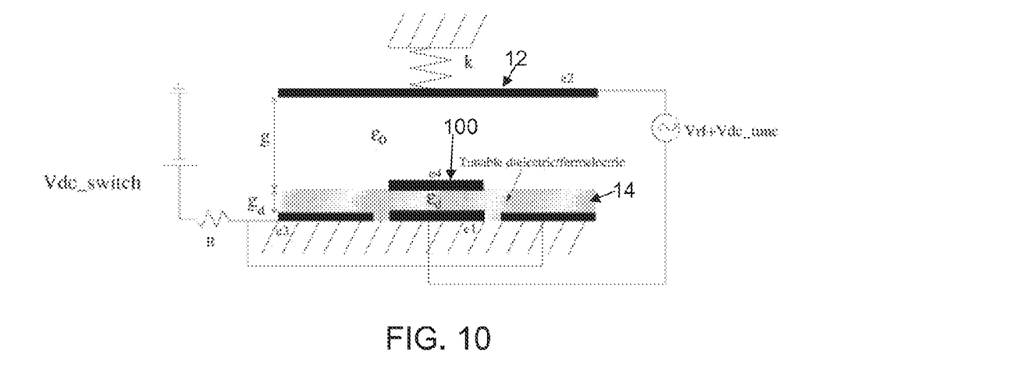
FIG. 10 shows a third alternative implementation in accordance with the invention.

FIG. 10 shows another implementation in which a further electrode 100 (e4) is provided on top of the tunable dielectric layer, so that when the MEMS switch is closed, a galvanic contact between the movable electrode 12 (e2) and the additional electrode 100 in the closed state will reduce the effect of electrode roughness on the capacitance density.

Figure 11:
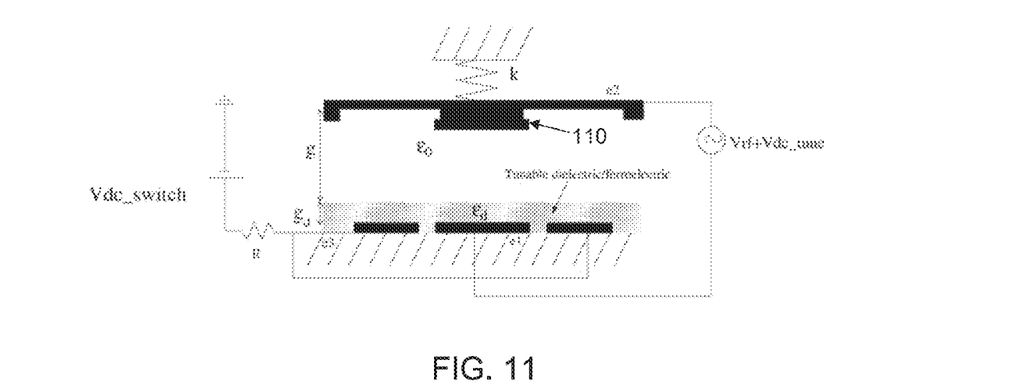
FIG. 11 shows a fourth alternative implementation in accordance with the invention.

FIG. 11 shows a further alternative implementation in which the movable plate is not flat, but has a raised portion 110 which acts to reduce the capacitor gap in the region having the tunable dielectric. This again prevents collapse by reducing the air gap.

The shaped profile generates and sustains gap variations and spring constant variations. Reference is made to WO 2006/046193 and WO2006/046192 for further discussion in connection with a shaped movable electrode in a MEMS device.

Figure 12:
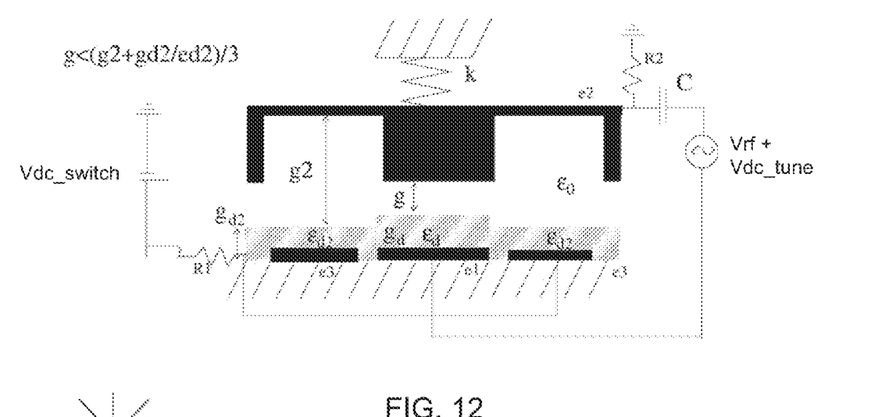
FIG. 12 is used to show a more general relationship for the gap relationships in accordance with the invention.

FIG. 12 is used to show a more general relationship for the gap relationships in accordance with the invention.

The movable plate is shown as having different thickness for different parts of the structure. In addition, the dielectric thickness is different over the MEMS switching electrodes and the dielectric tuning electrode.

The relationship for the permitted gap g which is closed by the MEMS switch is given by:

$$g < (g2 + gd2/\epsilon d2)/3 \quad (2)$$

This corresponds to equation (1), in that the effective actuation gap dimension is reduced to one third. The effective gap is taken to be g2+gd2/∈d2. Note that if there is no dielectric layer in the actuation path, then ∈d2=1 and Equation (2) simplifies to Equation (1), as g2+gd2=g+gd.

As mentioned above, one of the main applications of MEMS capacitors and tunable dielectrics is in tunable filters in the front-end of RF communications devices, such as mobile phones. Because the MEMS capacitor is switching the capacitance over a large ratio, it can effectively act as a switch. The tunable dielectric can be used for fine-tuning the filter frequency to the desired value. This is for example useful for implementing tunable filters and transmit/receive switches in mobile front-end of a mobile phone as shown in FIG. 13.

Figure 13:
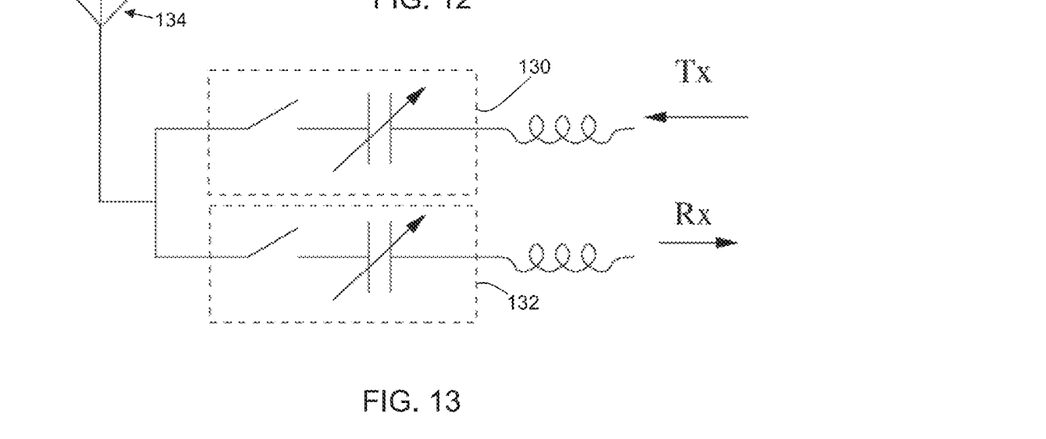
FIG. 13 shows capacitive MEMS switches of the invention used in a tunable antenna.

FIG. 13 shows two capacitive MEMS switches 130,132 with tunable dielectrics (indicated by a switch and a tunable capacitor) to provide tunable filters in transmit (Tx) and receive (Rx) channels in the path of an antenna 134. The switches provide isolation between Rx and Tx channels.

By putting several switch and tunable dielectrics in parallel, the continuous tuning range can be extended significantly. It can be assumed that the switching ratio of the MEMS switch is much larger than the tuning ratio of the tunable dielectric (this is usually the case). If the tunable dielectric has a continuous tuning ratio of 2, this tuning ratio can be increased by putting several of the proposed devices in parallel as is shown in FIGS. 14 and 15.

Figure 14:
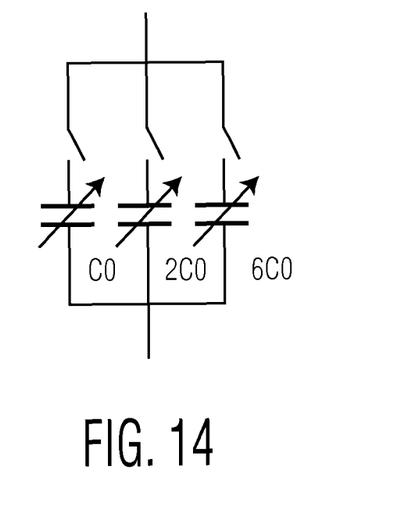
FIG. 14 shows tunable capacitors of the invention in parallel to extend the tunable range.
Figure 15:
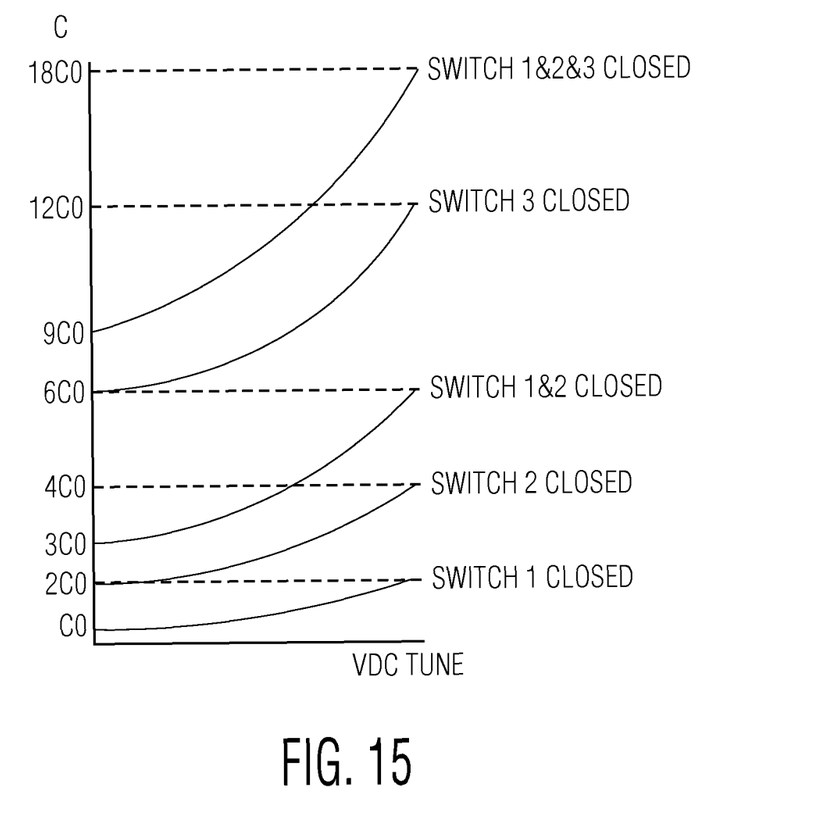
FIG. 15 shows the continuous tuning of parallel combinations of switches as shown in FIG. 14.

FIG. 14 shows three devices in parallel with capacitances C0, 2C0 and 6C0.

A continuous tuning of the tunable dielectric of a factor 2 is assumed. Capacitor values have been chosen to maximize the continuous tuning range from C0-18C0. The continuous tuning range is thus a factor 18.

The off capacitance of the MEMS switch is assumed to be negligible compared to the smallest parallel capacitance C0. The circuit in FIG. 14 can be a single device or it might be made using separate MEMS switches and tunable capacitors (although this would require more space).

A tuning range with a factor 17 could also be made using one device with a tunable dielectric (C0-2C0) in parallel with 4 switchable MEMS capacitors with capacitance values C0, 2C0, 4C0 and 8C0. This would require 5 devices instead of 3, but would only require one tunable dielectric device.

FIG. 15 shows the continuous tuning of parallel combinations of is switches as shown in FIG. 14. The continuous tuning range extends from C0 to 18 C0. Different curves correspond to different settings of the MEMS switches using the MEMS actuation voltage.

The invention thus enables the advantage of the large switching and tuning ratio of capacitive MEMS relays to be combined with the advantage of large continuous tuning at high power levels provided by tunable dielectric materials. A larger continuous tuning range can thus be obtained with better power handling and linearity. The PZT or BST high-k dielectrics also allow larger capacitance density in the closed state and thus device size reduction.

This size reduction also reduces parasitic resistances and inductances.

A switching and tuning function can be combined and controlled using separated voltages.

Figure 16:
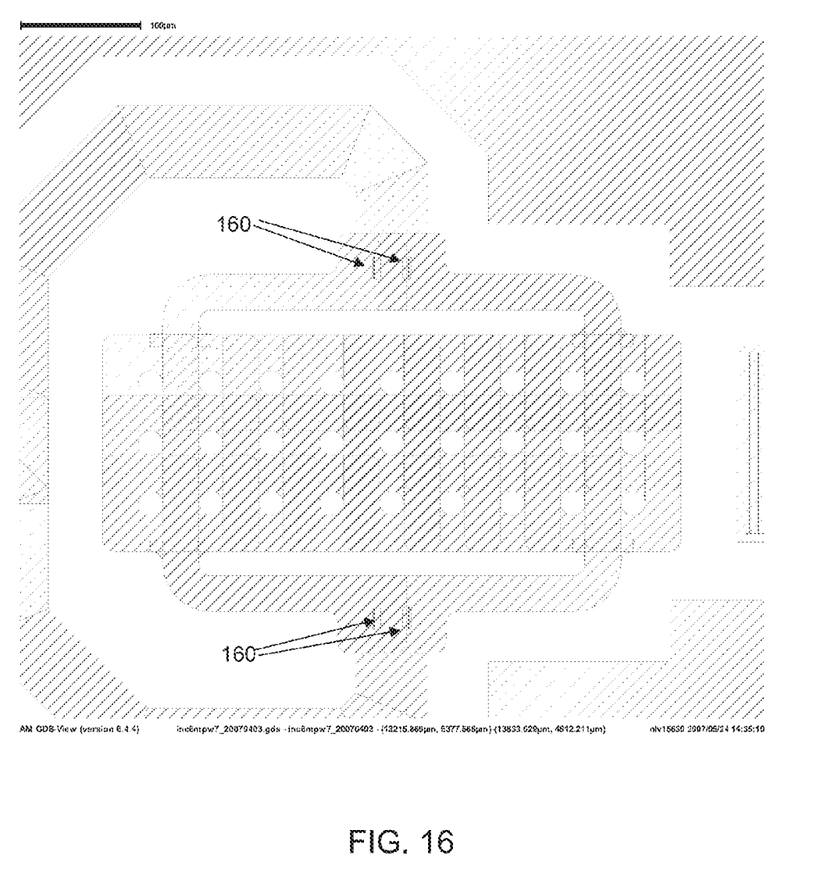
FIG. 16 shows a first way of implementing the movable electrode.
Figure 17:
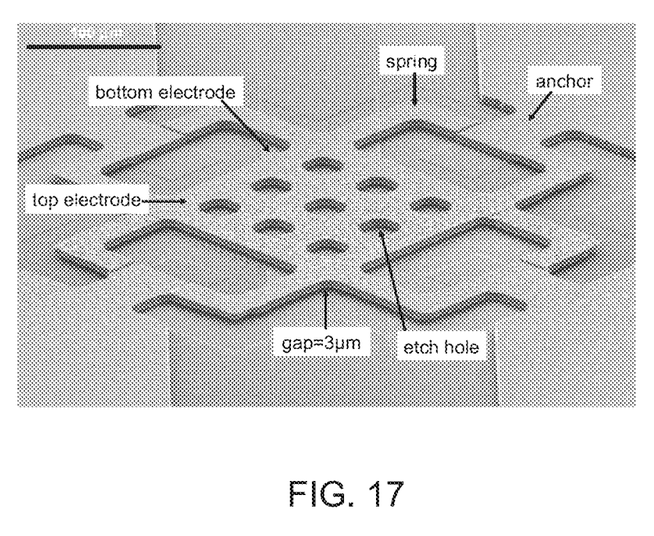
FIG. 17 shows a second way of implementing the movable electrode.

The structure of the movable beam has not been described in detail above. It can be favorable to have more than one spring/suspension arrangement. FIG. 16 shows an arrangement in top view, with 4 springs, fixed at the points 160. FIG. 17 shows an arrangement in top view, with 8 springs.

Various modifications will be apparent to those skilled in the art.

What is claimed is:

1. A capacitive MEMS structure comprising:
   first and second opposing capacitor plates, each capacitor plate provided with a plurality of electrically separated electrodes, wherein at least one of the capacitor plates is movable and an insulating substrate is provided between the electrically separated electrodes such that an independent voltage can be provided to each electrode;
   a tunable dielectric material layer over the plurality of electrically separated electrodes of the second capacitor plate between the opposing capacitor plates, wherein the tunable dielectric material layer is formed by a first dielectric material over at least a first electrically separated electrode and a second dielectric material over at least a second electrically separated electrode, the first dielectric material and the second dielectric material having different dielectric constants when a given voltage is applied; and
   a controller coupled to at least one of the first and second opposing capacitor plates, the controller configured to drive a first voltage for MEMS switching to a first electrode of the plurality of electrically separated electrodes of the capacitor plates and to drive a second voltage for dielectric tuning to a second electrode of the plurality of electrically separated electrodes of the capacitor plates, wherein a different gap distance is provided between opposite first electrodes than between opposite second electrodes and opposite third electrodes of the capacitor plates;
   wherein the second capacitor plate is patterned such that it includes electrode areas and spaces adjacent to the electrode areas, and wherein the tunable dielectric material extends at least partially in or over the spaces.

2. A capacitive MEMS structure as claimed in claim 1, wherein the spacing between electrode areas is at least equal to an electrode area width.

3. A capacitive MEMS structure according to claim 1, further comprising an element selected from the group consisting of:
   a tuneable capacitor;
   an electrical switch;
   a tunable dielectric material; and
   a sensor.

4. A capacitive MEMS structure as claimed in claim 1, wherein one capacitor plate is movable and the other capacitor plate is fixed.

5. A capacitive MEMS structure as claimed in claim 4, wherein the movable capacitor plate comprises a spring structure suspended over the fixed capacitor plate.

6. A capacitive MEMS structure as claimed in claim 1, further comprising a first dielectric region, wherein the tunable dielectric material is in series with the first dielectric region and arranged between the first and second capacitor plates.

7. A capacitive MEMS structure as claimed in claim 6, wherein the first dielectric region comprises a gas, fluid, vacuum or a soft polymer.

8. The capacitive MEMS structure of claim 1, wherein the tunable dielectric material layer is a ferroelectric or other tunable dielectric material.

9. The capacitive MEMS structure of claim 8, wherein the tunable dielectric material layer is at least one of barium strontium titanate and lead zirconate titanate.

10. A capacitive MEMS structure comprising: a first capacitor plate and a second capacitor plate arranged vertically opposite each other, wherein the first capacitor plate is comprised of a plurality of electrically separated electrodes and the second capacitor plate is comprised of a plurality of electrically separated electrodes;
    a tunable dielectric material layer layered vertically between the first and second capacitor plates;
    wherein the tunable dielectric material layer covers the electrodes of the second capacitor plate and extends into spaces formed between the electrically separated electrodes of the second capacitor plate, the first dielectric material and the second dielectric material having different dielectric constants when a given voltage is applied; and
    wherein the tunable dielectric material layer is formed by a first dielectric material over at least a first electrically separated electrode and a second dielectric material over at least a second electrically separated electrode in the plurality of electrically separated electrodes of the second capacitor plate; and
    a controller coupled to the electrodes of the second capacitor plate, the controller configured to drive a first voltage for MEMS switching to a first electrode of the plurality of electrically separated electrodes and to drive a second voltage for dielectric tuning to a second electrode of the plurality of electrically separated electrodes, wherein a different gap distance is provided between opposite first electrodes than between opposite second electrodes and opposite third electrodes of the capacitor plates; and
    wherein the electrodes of the first capacitor plate are separated by an insulating substrate such that an independent voltage can be provided to each electrode.

11. The capacitive MEMS structure of claim 10, wherein the electrodes of the first and second capacitor plate are composed of actuator electrodes and RF electrodes.

12. The capacitive MEMS structure of claim 10, wherein the tunable dielectric material that extends into the spaces forms a tunable layer.

13. A capacitive MEMS structure as claimed in claim 10, wherein one capacitor plate is movable and the other capacitor plate is fixed.

14. A capacitive MEMS structure as claimed in claim 13, wherein the movable capacitor plate comprises a sprung structure suspended over the fixed capacitor plate.

* * * * *